(12) United States Patent
Gong

(10) Patent No.: US 12,156,432 B2
(45) Date of Patent: Nov. 26, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jixiang Gong, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/391,996

(22) Filed: Dec. 21, 2023

(65) Prior Publication Data

US 2024/0172477 A1 May 23, 2024

Related U.S. Application Data

(63) Continuation of application No. 17/274,690, filed as application No. PCT/CN2020/126713 on Nov. 5, 2020, now Pat. No. 11,895,870.

(30) Foreign Application Priority Data

Jul. 17, 2020 (CN) .......................... 202010694709.1

(51) Int. Cl.
*H01L 27/14* (2006.01)
*H10K 59/121* (2023.01)
(Continued)

(52) U.S. Cl.
CPC ..... *H10K 59/1213* (2023.02); *H10K 59/1216* (2023.02); *H10K 59/124* (2023.02);
(Continued)

(58) Field of Classification Search
CPC ........... H10K 59/1213; H10K 59/1216; H10K 59/124; H10K 71/00; H10K 59/1201;
(Continued)

(56) References Cited

U.S. PATENT DOCUMENTS

| 10,741,625 B2 * | 8/2020 | Kang ................... G09G 3/3233 |
| 2016/0163746 A1 | 6/2016 | Ko |
| 2017/0186781 A1 | 6/2017 | Noh et al. |

FOREIGN PATENT DOCUMENTS

| CN | 103296034 A | 9/2013 |
| CN | 107731858 A | 2/2018 |

(Continued)

OTHER PUBLICATIONS

PCT International Search Report for International Application No. PCT/CN2020/126713, mailed on Apr. 19, 2021, 6pp.
(Continued)

*Primary Examiner* — Tan N Tran
(74) *Attorney, Agent, or Firm* — The Roy Gross Law Firm, LLC; Roy Gross

(57) ABSTRACT

A display panel includes a substrate; and a thin film transistor (TFT) array layer disposed on the substrate, the TFT array layer being provided with a first TFT, a plurality of second TFTs, and a storage capacitor arranged at intervals therein; wherein the first TFT comprises a polysilicon semiconductor layer and a first gate electrode laminated on each other, each of the second TFTs comprises an oxide semiconductor layer and a second gate electrode laminated on each other, the storage capacitor comprises a first polar plate and a second polar plate opposite to each other, the first polar plate is disposed in a same layer and comprises a same material as the first gate electrode, and the second polar plate is disposed in a same layer and comprises a same material as the second gate electrode.

13 Claims, 6 Drawing Sheets

(51) Int. Cl.
*H10K 59/124* (2023.01)
*H10K 71/00* (2023.01)
*H01L 27/12* (2006.01)
*H01L 29/66* (2006.01)
*H01L 29/786* (2006.01)
*H10K 59/12* (2023.01)

(52) U.S. Cl.
CPC .......... *H10K 71/00* (2023.02); *H01L 27/1225* (2013.01); *H01L 27/1248* (2013.01); *H01L 27/1251* (2013.01); *H01L 27/1255* (2013.01); *H01L 27/127* (2013.01); *H01L 29/66757* (2013.01); *H01L 29/66969* (2013.01); *H01L 29/78675* (2013.01); *H01L 29/7869* (2013.01); *H10K 59/1201* (2023.02)

(58) Field of Classification Search
CPC ............. H01L 27/1225; H01L 27/1248; H01L 27/1251; H01L 27/1255; H01L 27/127; H01L 29/66757; H01L 29/66969; H01L 29/78675; H01L 29/7869; H01L 27/3262; H01L 27/3265; H01L 27/3258; H01L 51/56; H01L 2227/323
USPC ...................................... 257/59, 72
See application file for complete search history.

(56) References Cited

FOREIGN PATENT DOCUMENTS

| | | |
|---|---|---|
| CN | 109273409 A | 1/2019 |
| CN | 110277427 A | 9/2019 |
| CN | 110649044 A | 1/2020 |
| CN | 110867459 A | 3/2020 |
| CN | 111341814 A | 6/2020 |
| CN | 111785759 A | 10/2020 |
| CN | 213150776 U | 5/2021 |

OTHER PUBLICATIONS

PCT Written Opinion of the International Searching Authority for International Application No. PCT/CN2020/126713, mailed on Apr. 19, 2021, 10pp.

Chinese Office Action issued in corresponding Chinese Patent Application No. 202021425496.4 dated Jan. 4, 2021, 3pp.

Chinese Office Action issued in corresponding Chinese Patent Application No. 202010694709.1 dated Jul. 11, 2024, pp. 1-12, 29pp.

* cited by examiner

DISPLAY PANEL AND DISPLAY DEVICE

CROSS-REFERENCE TO RELATED APPLICATION

This application is a continuation application of U.S. application Ser. No. 17/274,690, filed on Mar. 9, 2021, which is a US national phase application based upon an International Application No. PCT/CN2020/126713, filed on Nov. 5, 2020, which claims priority to Chinese Patent Application No. 202010694709.1, filed with the Chinese Patent Office on Jul. 17, 2020. The entire disclosures of the above applications are incorporated herein by reference.

TECHNICAL FIELD

The present invention relates to the field of display technology, in particular, to a display panel and a display device.

BACKGROUND

With development of wearable technology and lack of significant breakthroughs in current battery technology, people have increasingly higher requirements for power consumption of display devices. At present, low temperature poly-silicon (LTPS) technology for driving thin film transistors and switching thin film transistors is still a mainstream technology trend due to its low power consumption. However, due to a high mobility of carriers of the LTPS and high leakage current, low temperature polycrystal-si oxide (LTPO) technology came into being. The LTPO combine excellent points of the LTPS and the oxide, which can improve a response speed of the display devices and reduce the power consumption of the display devices.

As shown in FIG. 1, it is a schematic view of a film structure of a display panel using the low temperature polycrystalline oxide technology in prior art. Semiconductor layers of a driving thin film transistor 11 and a switching thin film transistor 12 are a polysilicon semiconductor layer and an oxide semiconductor layer, respectively. A storage capacitor 13 of the display panel is composed of a first gate electrode 111 disposed on a first gate insulation layer 14 and a second gate electrode 112 disposed on a second gate insulation layer 15. A third gate electrode 121 of the switching thin film transistor 12 is separated from metal layers of the first gate electrode 111 and the second gate electrode 112 by a third gate insulation layer 16. As a result, a number of film layers in the display panel and a thickness of film laminated structure are relatively large, which leads to complexity of production process of the display panel and also reduces bending ability of the display panel.

In summary, the display panels using the LTPO technology in prior art have problems of more film layers and a larger thickness of film laminated structure, which lead to complex production process of the display panels and reduced bending ability of the display panels. Therefore, it is necessary to provide a display panel and a display device to relieve the defects.

SUMMARY

The embodiments of the present invention provide a display panel, a manufacturing method thereof, and a display device, which are used to solve problems below: the display panels using the LTPO technology in prior art have more film layers and a larger thickness of film laminated structure, which lead to complex production process of the display panels and reduced bending ability of the display panels.

The embodiments of the present invention provide a display panel comprising:
  a substrate; and
  a thin film transistor (TFT) array layer disposed on the substrate, the TFT array layer being provided with a first TFT, a plurality of second TFTs, and a storage capacitor arranged at intervals therein;
  wherein the first TFT comprises a polysilicon semiconductor layer and a first gate electrode laminated on each other, each of the second TFTs comprises an oxide semiconductor layer and a second gate electrode laminated on each other, the storage capacitor comprises a first polar plate disposed on a side of the first gate electrode away from the substrate, the first gate electrode and the first polar plate constitute the storage capacitor, and the first polar plate is disposed in a same layer with the second gate electrode.

According to an embodiment of the present invention, a distance between a surface of the oxide semiconductor layer adjacent to the substrate and the substrate is greater than a distance between a surface of the polysilicon semiconductor layer adjacent to the substrate and the substrate.

According to an embodiment of the present invention, the TFT array layer comprises a first gate insulation layer and a first interlayer insulation layer laminated on the polysilicon semiconductor layer in sequence, the first gate electrode is disposed between the first gate insulation layer and the first interlayer insulation layer, and the oxide semiconductor layer is disposed on a side of the first interlayer insulation layer away from the first gate insulation layer.

According to an embodiment of the present invention, the first interlayer insulation layer is a laminated structure made of silicon nitride and silicon oxide materials, and an atomic percentage of silicon-hydrogen bonds in the first interlayer insulation layer ranges between 20% and 30%.

According to an embodiment of the present invention, the TFT array layer further comprises a second gate insulation layer and a second interlayer insulation layer laminated on a side of the first interlayer insulation layer away from the first gate insulation layer in sequence, and the first polar plate and the second gate electrode are both disposed between the second gate insulation layer and the second interlayer insulation layer.

According to an embodiment of the present invention, the first polar plate and the second gate electrode are made of a same layer of metal.

According to an embodiment of the present invention, the storage capacitor comprises a first capacitor and a second capacitor connected in parallel, a second polar plate is disposed between the first gate electrode and the first polar plate, the second polar plate and the first gate electrode constitute the first capacitor, and the second polar plate and the first polar plate constitute the second capacitor.

According to an embodiment of the present invention, an orthographic projection of the second polar plate on the substrate overlaps an orthographic projection of the first gate electrode or the first polar plate on the substrate.

According to an embodiment of the present invention, the second polar plate is disposed in a same layer with the oxide semiconductor layer.

According to an embodiment of the present invention, the second polar plate and the oxide semiconductor layer are made of a same layer of oxide material.

According to an embodiment of the present invention, the first TFT comprises a first source electrode and a first drain electrode, the second TFT comprises a second source electrode and a second drain electrode, the first source electrode and the first drain electrode are connected to the polysilicon semiconductor layer through first via holes, the first via holes pass through the second interlayer insulation layer, the second gate insulation layer, the first interlayer insulation layer, and the first gate insulation layer, the second source electrode and the second drain electrode are connected to the oxide semiconductor layer through second via holes, and the second via holes pass through the second interlayer insulation layer and the second gate insulation layer.

The embodiments of the present invention provide a display device, comprising a device body and a display panel disposed on the device body, the display panel comprises:
  a substrate; and
  a thin film transistor (TFT) array layer disposed on the substrate, the TFT array layer being provided with a first TFT, a plurality of second TFTs, and a storage capacitor arranged at intervals therein;
  wherein the first TFT comprises a polysilicon semiconductor layer and a first gate electrode laminated on each other, each of the second TFTs comprises an oxide semiconductor layer and a second gate electrode laminated on each other, the storage capacitor comprises a first polar plate disposed on a side of the first gate electrode away from the substrate, the first gate electrode and the first polar plate constitute the storage capacitor, and the first polar plate is disposed in a same layer with the second gate electrode.

According to an embodiment of the present invention, a distance between a surface of the oxide semiconductor layer adjacent to the substrate and the substrate is greater than a distance between a surface of the polysilicon semiconductor layer adjacent to the substrate and the substrate.

According to an embodiment of the present invention, the TFT array layer comprises a first gate insulation layer and a first interlayer insulation layer laminated on the polysilicon semiconductor layer in sequence, the first gate electrode is disposed between the first gate insulation layer and the first interlayer insulation layer, and the oxide semiconductor layer is disposed on a side of the first interlayer insulation layer away from the first gate insulation layer.

According to an embodiment of the present invention, the first interlayer insulation layer is a laminated structure made of silicon nitride and silicon oxide materials, and an atomic percentage of silicon-hydrogen bonds in the first interlayer insulation layer ranges between 20% and 30%.

According to an embodiment of the present invention, the TFT array layer further comprises a second gate insulation layer and a second interlayer insulation layer laminated on a side of the first interlayer insulation layer away from the first gate insulation layer in sequence, and the first polar plate and the second gate electrode are disposed between the second gate insulation layer and the second interlayer insulation layer.

According to an embodiment of the present invention, the first polar plate and the second gate electrode are made of a same layer of metal.

According to an embodiment of the present invention, the storage capacitor comprises a first capacitor and a second capacitor connected in parallel, a second polar plate is disposed between the first gate electrode and the first polar plate, the second polar plate and the first gate electrode constitute the first capacitor, and the second polar plate and the first polar plate constitute the second capacitor.

According to an embodiment of the present invention, an orthographic projection of the second polar plate on the substrate overlaps an orthographic projection of the first gate electrode or the first polar plate on the substrate.

The embodiments of the present invention further provide a display device, comprising a device body and a display panel disposed on the device body, the display panel comprises:
  a substrate; and
  a thin film transistor (TFT) array layer disposed on the substrate, the TFT array layer being provided with a first TFT, a plurality of second TFTs, and a storage capacitor arranged at intervals therein;
  wherein the first TFT comprises a polysilicon semiconductor layer and a first gate electrode laminated on each other, each of the second TFTs comprises an oxide semiconductor layer and a second gate electrode laminated on each other, the TFT array layer further comprises a first gate insulation layer, a first interlayer insulation layer, a second gate insulation layer, and a second interlayer insulation layer laminated on the polysilicon semiconductor layer in sequence, the storage capacitor comprises a first polar plate disposed on a side of the first gate electrode away from the substrate, the first gate electrode and the first polar plate constitute the storage capacitor, and the first polar plate and the second gate electrode are arranged in a same layer and disposed between the second gate insulation layer and the second interlayer insulation layer.

The embodiments of the present invention further provide a manufacturing method of a display panel, comprising:
  providing a substrate, and forming a polysilicon semiconductor layer on the substrate;
  forming a first gate insulation layer covering the polysilicon semiconductor layer on the substrate;
  forming a first gate electrode on a side of the first gate insulation layer away from the substrate;
  forming a first interlayer insulation layer covering the first gate electrode on a side of the first gate insulation layer away from the substrate;
  forming an oxide semiconductor layer on a side of the first interlayer insulation layer away from the first gate insulation layer;
  forming a second gate insulation layer covering the oxide semiconductor layer on a side of the first interlayer insulation layer away from the gate insulation layer;
  depositing a metal material on a side of the second gate insulation layer away from the substrate, and forming a first polar plate and a plurality of second gate electrodes arranged at intervals by a patterning process, wherein the first polar plate and the first gate electrode constitute a storage capacitor; and
  forming a first source electrode, a first drain electrode, a second source electrode, and a second drain electrode on a side of the second gate electrode away from the second gate insulation layer, wherein the first source electrode, the first drain electrode, the first gate electrode, and the polysilicon semiconductor layer constitute a first thin film transistor, and the second source electrode, the second drain electrode, the second gate electrode, and the oxide semiconductor layer constitute a second thin film transistor.

According to an embodiment of the present invention, the step of forming an oxide semiconductor layer comprises:

depositing a layer of oxide semiconductor material on a side of a first interlayer insulation layer away from a first gate insulation layer; and forming a plurality of oxide semiconductor layers and a second polar plate arranged at intervals by a patterning process, wherein the second polar plate and the first gate electrode constitute a first capacitor of a storage capacitor, and the second polar plate and the first polar plate constitute a second capacitor of the storage capacitor.

In the embodiments of the present invention, the first gate electrode and the first polar plate of the first thin film transistor are used to constitute a storage capacitor, at the same time, the first polar plate and the second gate electrode of the second thin film transistor are disposed in the same layer. Therefore, the gate insulation layer used to separate the first polar plate from the first gate electrode and the second gate electrode in layers can be omitted, so as to reduce the number of film layers in the display panel and the thickness of the film laminated structure, thereby reducing a complexity of a process flow of the display panel, and improving the bending ability of the display panel.

BRIEF DESCRIPTION OF THE DRAWINGS

In order to explain the technical solutions in the embodiments or the prior art more clearly, the following will introduce briefly the drawings used in the description of the embodiments or the prior art. Obviously, the drawings in the following description are merely several embodiments of the present invention. For those skilled in the art, other drawings can be obtained based on these drawings without creative work.

DETAILED DESCRIPTION OF EMBODIMENTS

Figure 1:
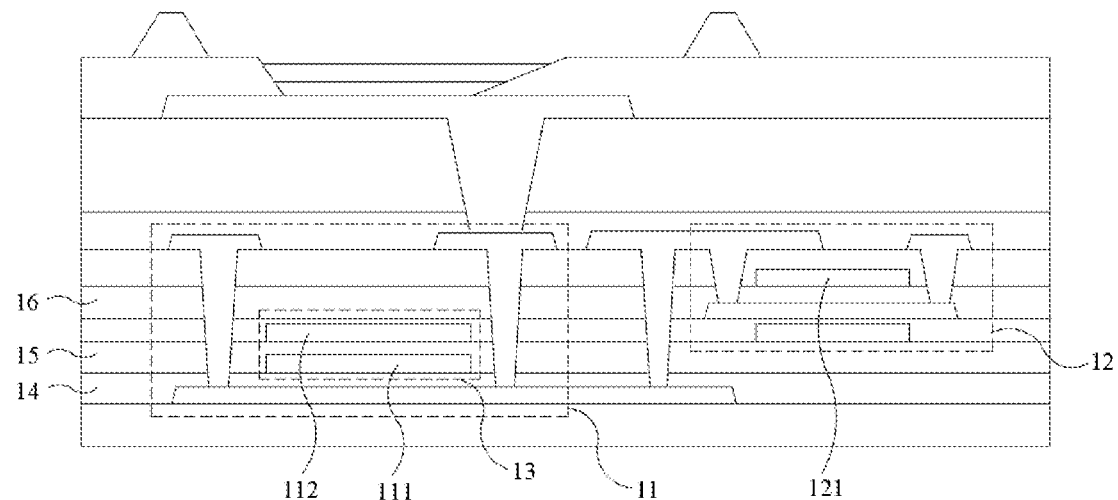
FIG. 1 is a schematic view of a film structure of a display panel in the prior art.

The following description of every embodiment with reference to the accompanying drawings is used to exemplify a specific embodiment which may be carried out in the present invention. The directional terms mentioned herein, such as "Up", "Down", "Front", "Back", "Left", "Right", "Inner", "Outer", "Side", etc., are for referring to the directions in the drawings. Therefore, the used directional terms are intended to illustrate, but not to limit, the present invention. In the drawings, units with similar structures are indicated by a same reference numeral.

The present invention will be further described below in conjunction with the drawings and specific embodiments.

Figure 2:
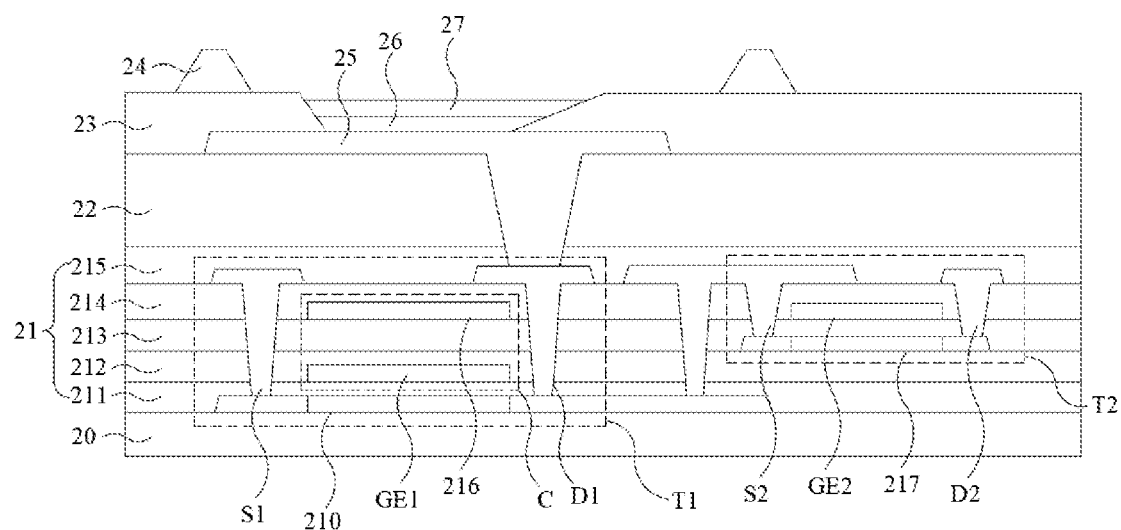
FIG. 2 is a schematic view of a film structure of a first display panel in accordance with an embodiment of the present invention.

An embodiment of the present invention provides a display panel, which will be described in detail below with reference to FIG. 2. FIG. 2 is a schematic view of a film structure of a display panel in accordance with an embodiment of the present invention. The display panel provided by this embodiment of the present invention comprises a substrate 20, a thin film transistor array layer 21 disposed on the substrate 20, and a display device layer disposed on a side of the thin film transistor array layer 21 away from the substrate 20.

In this embodiment of the present invention, the substrate 20 comprises a first substrate, a barrier layer, a second substrate, a buffer layer, and a third substrate (not shown in the figure) laminated in sequence, the first substrate and the second substrate are both made of polyimide materials, and the third substrate is a laminated structure formed of silicon nitride, silicon oxide, and amorphous silicon materials. Of course, the material and structure of the substrate 20 are not limited to the materials and structures provided in this embodiment of the present invention. In some other embodiments, the substrate 20 may also be other structures and materials, which are not limited herein.

The display panel provided by this embodiment of the present invention may be an organic light emitting diode display panel. The display device layer comprises a planarization layer 22 disposed on a side of the thin film transistor array layer 21 away from the substrate 20, a pixel definition layer 23, a plurality of spacers 24 disposed on a surface of the pixel definition layer 23, and an anode 25, a light emitting layer 26, and a cathode 27 laminated on a side of the planarization layer 22 away from the substrate 20. The structure and material are the same as those of the organic light emitting diode display devices in the prior art, and will not be repeated herein. Of course, the display devices in the display device layer are not limited to the organic light emitting diode devices in this embodiment of the present invention. In some other embodiments, the display devices in the display device layer may also comprise, but are not limited to, micro light emitting diodes, mini light emitting diodes, and other light emitting display devices. Types of display devices can be selected according to actual needs, and there is no limitation herein.

As shown in FIG. 2, in this embodiment of the present invention, the thin film transistor array layer 21 is provided with a first thin film transistor T1, a plurality of second thin film transistors T2, and a storage capacitor C arranged at intervals therein. The first thin film transistor T1, the second thin film transistors T2, the storage capacitor C, and circuit wirings disposed in the thin film transistor array layer 21 constitute a pixel driving circuit of each sub-pixel unit in the display panel.

The pixel driving circuit provided by this embodiment of the present invention is a 7T1C pixel driving circuit, which comprises one driving thin film transistor, six switching thin film transistors, and one storage capacitor C. The first thin film transistor T1 is a driving thin film transistor, and the second thin film transistor T2 is a switching thin film transistor. Of course, in other embodiments, the pixel driving circuit of the display panel can also have other circuit structures, and the number of internal driving thin film transistors, switching thin film transistors, and capacitors is not limited to the number provided in this embodiment of the present invention. The specific structure can be set according to actual needs, and there is no limitation herein.

In this embodiment of the present invention, the first thin film transistor T1 comprises a polysilicon semiconductor layer 210 and a first gate electrode GE1 laminated on each other, a first source electrode S1 and a first drain electrode D1 disposed on a side of the first gate electrode GE1 away from the polysilicon semiconductor layer 210. The second thin film transistor T2 comprises an oxide semiconductor layer 217 and a second gate electrode GE2 laminated on each other, and a second source electrode S2 and a second drain electrode D2 disposed on a side of the second gate electrode GE2 away from the oxide semiconductor layer 217. The storage capacitor C comprises a first polar plate 216 disposed on a side of the first gate electrode GE1 away from the substrate 20. An orthographic projection of the first polar plate 216 and the first gate electrode GE1 on the substrate 20 overlaps an orthographic projection of a channel region of the polysilicon semiconductor layer 210 on the substrate 20. An orthographic projection of the second gate electrode GE2 on the substrate 20 overlaps an orthographic projection of the oxide semiconductor layer 217 on the substrate 20. The first polar plate 216 and the first gate electrode GE1 of the first thin film transistor T1 constitute a storage capacitor C, and the first polar plate 216 and the second gate electrode GE2 are disposed on the same film layer.

In this embodiment of the present invention, the polysilicon semiconductor layer 210 is a low temperature polysilicon semiconductor layer, and the material of the oxide semiconductor layer 217 is preferably indium gallium zinc oxide (IGZO). Of course, in some other embodiments, the material of the oxide semiconductor layer 217 may also comprise, but is not limited to, oxide semiconductor materials such as indium gallium oxide or indium zinc oxide. The specific material can be selected according to actual needs, and there is no limitation herein.

As shown in FIG. 2, a distance between a surface of the oxide semiconductor layer 217 of the second thin film transistor T2 adjacent to the substrate 20 and the substrate is greater than a distance between a surface of the polysilicon semiconductor layer 210 of the first thin film transistor T1 adjacent to the substrate 20 and the substrate.

Specifically, referring to FIG. 2, the thin film transistor array layer 21 comprises a first gate insulation layer 211 and a first interlayer insulation layer 212 laminated on the polysilicon semiconductor layer 210 in sequence, the first gate insulation layer 211 covers the polysilicon semiconductor layer 210, the first gate electrode GE1 is disposed between the first gate insulation layer 211 and the first interlayer insulation layer 212, and the oxide semiconductor layer 217 is disposed on a side of the first interlayer insulation layer 212 away from the first gate insulation layer 211. By disposing the oxide semiconductor layer 217 on the side of the polysilicon semiconductor layer 210 away from the substrate 20, a structure and properties of the oxide semiconductor layer 217 can be prevented from being damaged by a high temperature during a preparation of the polysilicon semiconductor layer 210.

In this embodiment of the present invention, a material of the first gate insulation layer 211 is silicon oxide, the first interlayer insulation layer 212 is a laminated structure made of silicon nitride and silicon oxide materials, the silicon nitride film is disposed between the silicon oxide film and the first gate insulation layer 211, and an atomic percentage of silicon-hydrogen bonds in the first interlayer insulation layer 212 is 25%. By increasing a hydrogen content in the first interlayer insulation layer 212, a stability of the polysilicon semiconductor layer 210 can be improved, and the silicon oxide film in the first interlayer insulation layer 212 can also be used to prevent a diffusion of hydrogen ions in the silicon nitride film to the oxide semiconductor layer 217, thus ensuring that a stability of the oxide semiconductor layer 217 is not affected. Of course, the atomic percentage of silicon-hydrogen bonds in the first interlayer insulation layer 212 is not limited to the settings provided in this embodiment of the present invention. In some other embodiments, the atomic percentage of the silicon-hydrogen bonds in the first interlayer insulation layer 212 can also comprise, but is not limited to, 20% or 30%, and the atomic percentage is preferably between 20% and 30%. The specific value can be set according to actual needs, and there is no limitation herein.

Furthermore, the thin film transistor array layer 21 further comprises a second gate insulation layer 213 and a second interlayer insulation layer 214 laminated on a side of the first interlayer insulation layer 212 away from the first gate insulation layer 211 in sequence, and the first polar plate 216 and the second gate electrode GE2 are both disposed between the second gate insulation layer 213 and the second interlayer insulation layer 214. Compared with the display panel shown in FIG. 1, the display panel provided by this embodiment of the present invention has the first polar plate 216 of the storage capacitor and the second gate electrode GE2 of the second thin film transistor T2 disposed on the same layer, and the second gate insulation layer 213 under the second gate electrode GE2 is used to separate the film layer where the second gate electrode GE2 and the first polar plate 216 are located from the metal film layer where the first gate electrode GE1 is located. As such, an original gate insulation layer formed of inorganic insulation material for separating the metal film layer where the first gate electrode GE1 is located from the metal film layer where the first polar plate 216 is located can be canceled, thereby reducing the number of film layers in the display panel and the thickness of the film laminated structure, reducing in turn a complexity of a process flow of the display panel, and improving the bending ability of the display panel.

Preferably, in this embodiment of the present invention, the first polar plate 216 and the second gate electrode GE2 are made of the same layer of metal, so one mask can be used to simultaneously prepare the first polar plate 216 and the second gate electrode GE2. As a result, the mask and related processes required for preparing the first polar plate 216 alone can be omitted, thereby reducing the complexity of the process flow of the display panel and the production cost. Of course, in some embodiments, although the first polar plate 216 and the second gate electrode GE2 are disposed on the same layer, they can be made of different materials and prepared by different processes, and there is no limitation herein.

Specifically, as shown in FIG. 2, the first source electrode S1, the first drain electrode D1, the second source electrode S2, and the second drain electrode D2 are all disposed between the second interlayer insulation layer 214 and a passivation protection layer 215. The first source electrode S1 and the first drain electrode D1 are respectively connected to a first source electrode region and a first drain electrode region of the polysilicon semiconductor 210 through a plurality of first via holes. The plurality of first via holes pass through the second interlayer insulation layers 214, the second gate insulation layer 213, the first interlayer insulation layer 212, and the first gate insulation layer 211. An anode 25 disposed between the planarization layer 22 and the pixel definition layer 23 is connected to the first drain electrode D1 through a via hole. The second source electrode S2 and the second drain electrode D2 connect to a second source electrode region and a second drain electrode region of the oxide semiconductor layer 217 through a plurality of second via holes. The plurality of second via holes pass through the second interlayer insulation layer 214 and the second gate insulation layer 213.

The beneficial effects of this embodiment of the present invention are: in this embodiments of the present invention, the first gate electrode and the first polar plate of the first thin film transistor are used to constitute a storage capacitor, at the same time, the first polar plate and the second gate electrode of the second thin film transistor are disposed in the same layer. Therefore, the gate insulation layer used to separate the first polar plate from the first gate electrode, as well as the mask required to form the first polar plate can be omitted, so as to reduce the number of film layers in the display panel and the thickness of the film laminated structure, thereby reducing a complexity of a process flow of the display panel and production cost, and improving the bending ability of the display panel.

Figure 3:
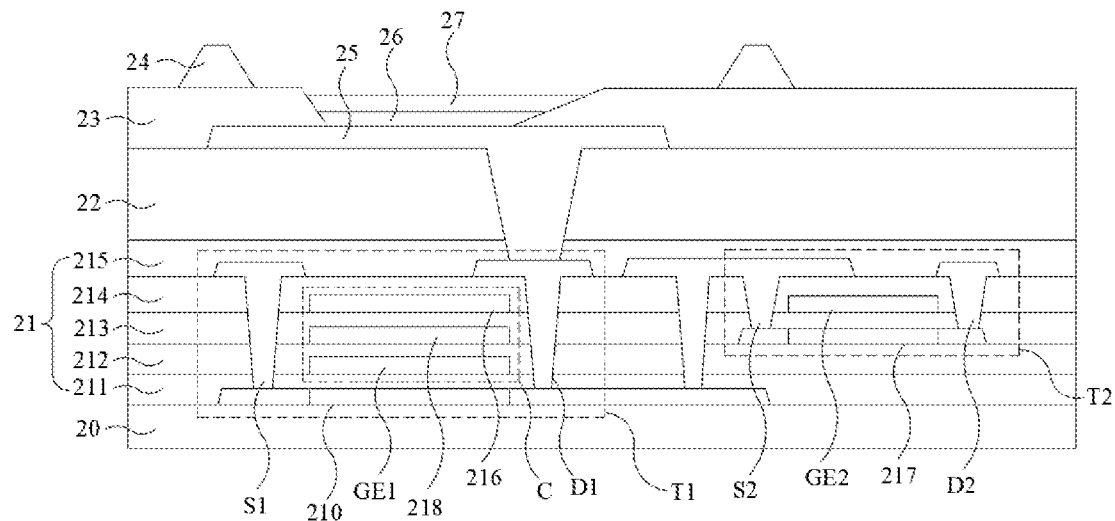
FIG. 3 is a schematic view of a film structure of a second display panel in accordance with an embodiment of the present invention.

An embodiment of the present invention further provides a display panel, which will be described in detail below with reference to FIG. 3. FIG. 3 is a schematic view of a film structure of a display panel in accordance with an embodiment of the present invention. The structure of the display panel provided by this embodiment of the present invention is substantially the same as the display panel provided by the above-mentioned embodiment, and will not be repeated herein. A difference between the display panel provided by this embodiment of the present invention and the display panel provided by the above-mentioned embodiment is that, the storage capacitor C in this embodiment of the present invention comprises a first capacitor and a second capacitor connected in parallel, and a second polar plate 218 is disposed between the first gate electrode GE1 and the first polar plate 216. An orthographic projection of the second polar plate 218 on the substrate 20 overlaps orthographic projections of the first polar plate 216 and the first gate electrode GE1 on the substrate 20, respectively.

The first gate electrode GE1 and the second polar plate 218 constitute a first capacitor, and the first polar plate 216 and the second polar plate 218 constitute a second capacitor. The first capacitor and the second capacitor are connected in parallel by signal wirings disposed in the thin film transistor array layer 21. As such, a unit capacitance of the storage capacitor C is increased, so that a size of the storage capacitor C can be compressed while the capacitance of the storage capacitor C remains unchanged, thereby reducing an area occupied by the pixel circuit and improving the resolution of the display panel. Of course, in some other embodiments, it is also possible to increase the capacitance of the storage capacitor C by a method of this embodiment under the condition that a size of the storage capacitor C remains unchanged, so that when the storage capacitor C stores a potential signal, it is less affected by a leakage current, thereby improving a stability of the display panel's display effect in a state of low refresh rate or low power consumption.

Furthermore, in this embodiment of the present invention, the second polar plate 218 and the oxide semiconductor layer 217 of the second thin film transistor T2 are disposed in the same layer, so that when the second polar plate 218 is added, the original film number and film structure of the display panel can be kept unchanged, and in turn the bending performance of the display panel is not affected.

Of course, a position of the second polar plate 218 is not limited to the same layer as the oxide semiconductor layer 217 provided in this embodiment of the present invention. In some other embodiments, the second polar plate 218 can be disposed in a film layer between the first gate electrode GE1 and the first polar plate 216 other than the film layer where the oxide semiconductor layer 217 is located. It can also achieve the same technical effect as the above-mentioned embodiment, and a specific position of the film layer can be selected according to the actual situation, and there is no limitation herein.

Preferably, in this embodiment of the present invention, the second polar plate 218 and the oxide semiconductor layer 217 are made of the same layer of oxide material, so one mask can be used to simultaneously prepare the oxide semiconductor layer 217 and the second polar plate 218. As a result, the mask and related processes required for preparing the second polar plate 218 alone can be omitted, thereby reducing the complexity of the process flow of the display panel and the production cost. Of course, in some embodiments, although the second polar plate 218 and the second gate electrode GE2 are disposed on the same layer, they can be made of different materials and prepared by different processes, and there is no limitation herein.

The beneficial effects of this embodiment of the present invention are: in this embodiments of the present invention, the first gate electrode and the first polar plate of the first thin film transistor are used to constitute a storage capacitor, at the same time, a second polar plate is disposed between the first gate electrode and the first polar plate. The second polar plate forms a first capacitor and a second capacitor connected in parallel in the storage capacitor with the first gate electrode and the first polar plate respectively. At the same time, the first polar plate and the second gate electrode of the second thin film transistor are disposed in the same layer, and the second polar plate and the oxide semiconductor layer are disposed in the same layer. Therefore, the gate insulation layer used to separate the first polar plate from the first gate electrode, as well as the masks respectively used to prepare the first polar plate and the second polar plate can be omitted, so as to reduce the number of film layers in the display panel and the thickness of the film laminated structure, thereby reducing a complexity of a process flow of the display panel and production cost, and improving the bending ability of the display panel and the display effect of the display panel.

Figure 4:
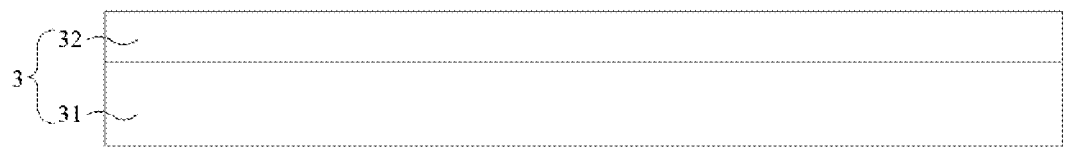
FIG. 4 is a schematic view of a structure of a display device in accordance with an embodiment of the present invention.

An embodiment of the present invention further provides a display device, which will be described in detail below with reference to FIG. 4. FIG. 4 is a schematic view of a structure of a display device in accordance with an embodiment of the present invention. As shown in FIG. 4, the display device 3 comprises a device body 31 and a display panel 32. The device body 31 comprises a frame assembly and components such as a power supply, a processor, and a camera (not shown in the figure) provided in the frame assembly. The display panel 32 is provided on the device body 31. The display panel 32 provided in this embodiment of the present invention is any one of the display panels provided in the above-mentioned embodiment, and the display device 3 provided in this embodiment of the present invention can also achieve the same technical effects as the display panel provided in the above-mentioned embodiment, and will not be repeated herein.

Figure 5A:
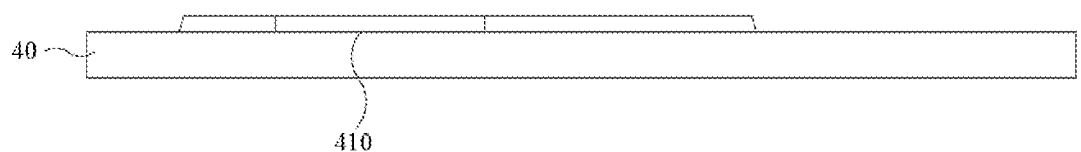
FIGS. 5A to 5I are schematic views of the film structure of the display panel corresponding to a manufacturing method of the first display panel in accordance with an embodiment of the present invention.
Figure 5B:
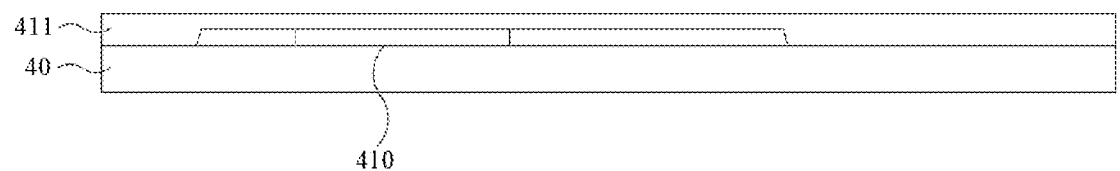
Figure 5C:
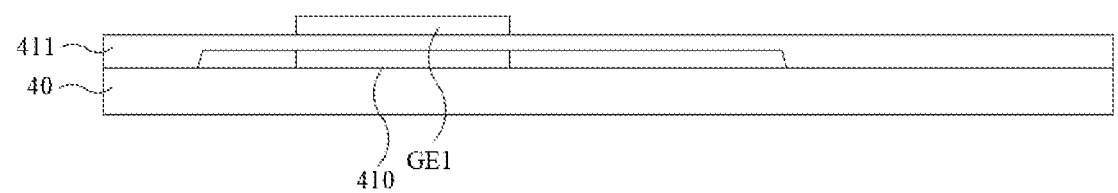
Figure 5D:
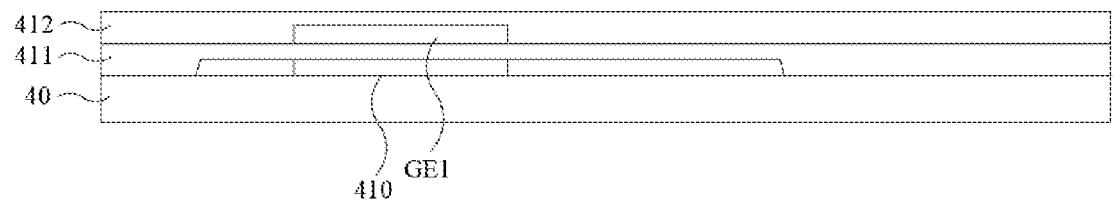
Figure 5E:
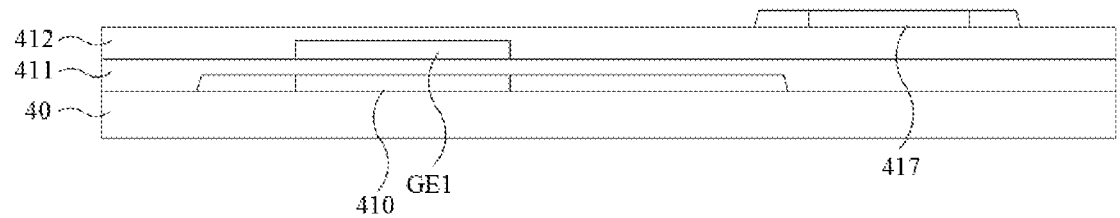
Figure 5F:
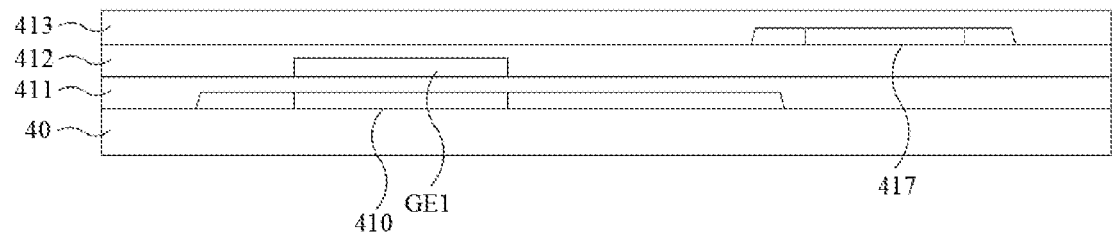
Figure 5G:
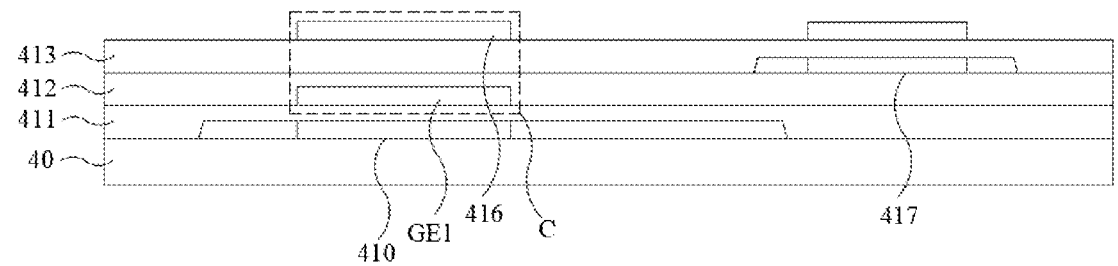
Figure 5H:
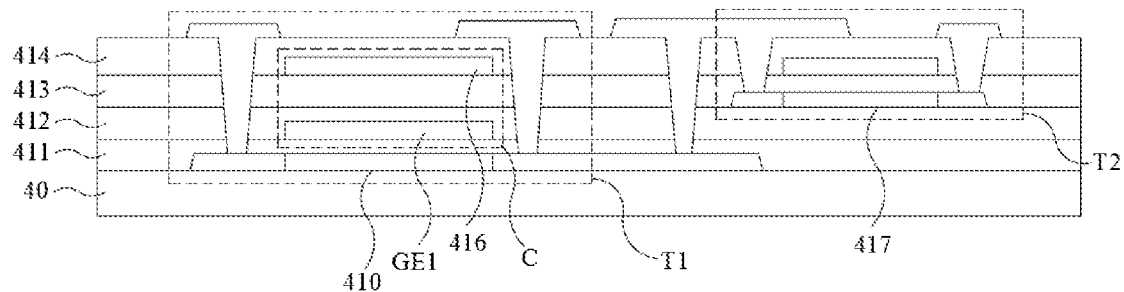
Figure 5I:
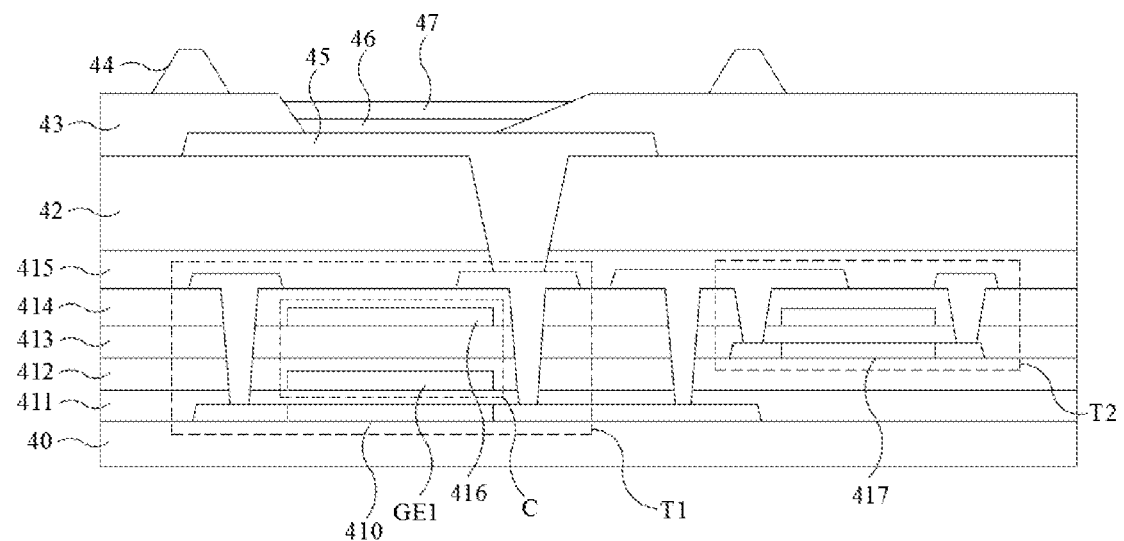

The embodiments of the present invention also provide a manufacturing method of a display panel, which will be described in detail below with reference to FIGS. 5A to 5I. FIGS. 5A to 5I are schematic views of the film structure of the display panel corresponding to a manufacturing method of the first display panel in accordance with an embodiment of the present invention. The manufacturing method of the display panel provided by this embodiment of the present invention comprises:

Step S1: as shown in FIG. 5A, providing a substrate 40, and forming a polysilicon semiconductor layer 410 on the substrate 40;

Step S2: as shown in FIG. 5B, forming a first gate insulation layer 411 covering the polysilicon semiconductor layer 410 on the substrate 40;

Step S3: as shown in FIG. 5C, depositing a metal material on a side of the first gate insulation layer 411 away from the substrate 40, and forming a patterned first gate electrode GE1 by a patterning process. An orthographic projection of the first gate electrode GE1 on the substrate 40 overlaps an orthographic projection of a channel region of the polysilicon semiconductor layer 410 on the substrate 40;

Step S4: as shown in FIG. 5D, forming a first interlayer insulation layer 412 covering the first gate electrode GE1 on a side of the first gate insulation layer 411 away from the substrate 40;

Step S5: as shown in FIG. 5E, forming an oxide semiconductor layer 417 on a side of the first interlayer insulation layer 412 away from the first gate insulation layer 411;

Step S6: as shown in FIG. 5F, forming a second gate insulation layer 413 covering the oxide semiconductor layer 417 on a side of the first interlayer insulation layer 412 away from the gate insulation layer;

Step S7: as shown in FIG. 5G, depositing a metal material on a side of the second gate insulation layer 413 away from the substrate 40, and forming a first polar plate 416 and a plurality of second gate electrodes GE2 arranged at intervals by a patterning process, an orthographic projection of the first polar plate 416 on the substrate 20 overlaps an orthographic projection of the first gate electrode GE1 on the substrate, and the first polar plate 416 and the first gate electrode GE1 constitute a storage capacitor C;

Step S8: as shown in FIG. 5H, forming a second interlayer insulation layer 414 covering the second gate electrode GE2 and the first polar plate 416 on a side of the second gate electrode GE2 away from the second gate insulation layer 413, etching a plurality of first via holes which pass through the second interlayer insulation layer 414, the second gate insulation layer 413, the first interlayer insulation layer 412, and the first gate insulation layer 411, and a plurality of second via holes which pass through the second interlayer insulation layer 414 and the second gate insulation layer 413, forming a first source electrode S1, a first drain electrode D1, a second source electrode S2, and a second drain electrode D2 on the second interlayer insulation layer 414. The first source electrode S1, the first drain electrode D1, the first gate electrode GE1, and the polysilicon semiconductor layer 410 constitute a first thin film transistor T1, and the second source electrode S2, the second drain electrode D2, the second gate electrode GE2, and the oxide semiconductor layer 417 constitute a second thin film transistor T2; and Step S9: As shown in FIG. 5I, forming a passivation protection layer 415 covering the first source electrode S1, the first drain electrode D1, the second source electrode S2 and the second drain electrode D2 on the second interlayer insulation layer 414, and forming a planarization layer 42, an anode 45, a pixel definition layer 43, a light emitting layer 46, a cathode 47, and a plurality of spacers 44 on a surface of the passivation protection layer 415 away from the second interlayer insulation layer 414 in sequence, the plurality of spacers 44 are arranged at intervals on a surface of the pixel definition layer 43. The manufacturing method in step S9 is the same as the manufacturing method in the prior art, and will not be repeated herein.

In step S4 of this embodiment of the present invention, the formed first interlayer insulation layer 412 is a laminated structure of silicon nitride and silicon oxide materials, the silicon nitride film is disposed between the silicon oxide film and the first gate insulation layer 411. The silicon nitride film needs to be prepared in a SiH4+NH3+N2 gas atmosphere. By adjusting a proportion of SiH4 in the gas atmosphere, an atomic percentage of silicon-hydrogen bonds in the first interlayer insulation layer 412 is controlled between 20% and 30%, thereby a stability of the polysilicon semiconductor layer 410 can be improved, and the silicon oxide film in the first interlayer insulation layer 412 can also be used to prevent a diffusion of hydrogen ions in the silicon nitride film to the oxide semiconductor layer 417, thus ensuring that a stability of the oxide semiconductor layer 417 is not affected.

In step S7 of this embodiment of the present invention, the deposited metal material may be a laminated structure formed by multiple metal materials such as Cu, Al, and Mo. In other embodiments, the second gate electrode GE2 and the first polar plate 416 may also be other conductive materials and structures, and there is no limitation herein. In step S7, the first polar plate 416 of the storage capacitor C is formed at the same time by the patterning process of the second gate electrode GE2, and a mask and related processes required for preparing the first polar plate 416 alone can be omitted. At the same time, in the structure, the gate insulation layer used to separate the metal film layer where the first polar plate 416 is located from the metal film layer where the first gate electrode GE1 is located can also be omitted, thereby not only reducing a complexity of a process flow of the display panel, but also reducing the number of film layers in the display panel and the thickness of the film laminated structure, and improving the bending ability of the display panel.

The beneficial effects of this embodiment of the present invention are: the manufacturing method of the display panel provided by this embodiment of the present invention forms the first polar plate of the storage capacitor at the same time by the process of preparing the second gate electrode, so that a mask and related processes required for preparing the first polar plate can be omitted. Therefore, a complexity of a process flow of the display panel is reduced, and the number of film layers in the display panel and the thickness of the film laminated structure is also reduced, thereby improving the bending ability of the display panel.

Figure 6A:
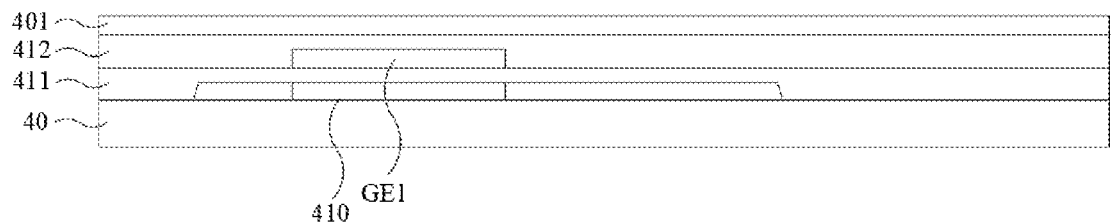
FIGS. 6A to 6B are schematic views of the film structure of the display panel corresponding to a manufacturing method of the second display panel in accordance with an embodiment of the present invention.
Figure 6B:
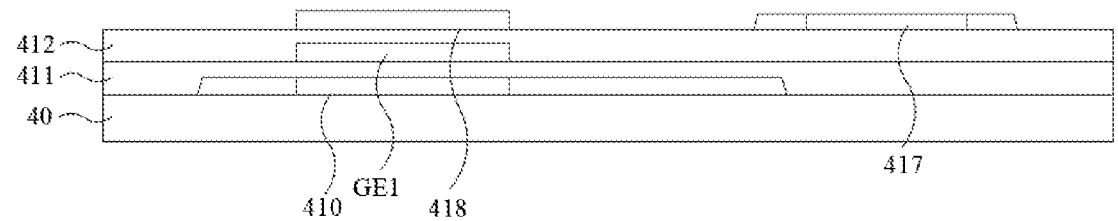

An embodiment of the present invention further provides a manufacturing method of a display panel, the steps of which are substantially the same as the manufacturing method mentioned in the foregoing embodiment, and will not be repeated herein. As shown in FIGS. 6A and 6B, FIGS. 6A and 6B are schematic views of the film structure of the display panel corresponding to a manufacturing method of the display panel in accordance with this embodiment of the present invention, a difference between the manufacturing method of the display panel provided by this embodiment of the present invention and the manufacturing method of the display panel provided by the foregoing embodiment is that, the step S5 of forming an oxide semiconductor layer comprises:

Step S501: as shown in FIG. 6A, depositing a layer of oxide semiconductor material 401 on a side of the first interlayer insulation layer 412 away from the first gate insulation layer 411; and Step S502: as shown in FIG. 6B, forming a plurality of oxide semiconductor layers 417 and a second polar plate 418 arranged at intervals by a patterning process, an orthographic projection of the second polar plate 418 on the substrate 40 overlaps an orthographic projection of the first gate electrode GE1 on the substrate 40.

The subsequent steps of this embodiment of the present invention are substantially the same as the manufacturing method provided in the foregoing embodiment, and the structure of the display panel formed therefrom is the same as the structure of the display panel as shown in FIG. 3 in the foregoing embodiment, and will not be repeated herein. The second polar plate 418 formed in step S502 can form a first capacitor and a second capacitor connected in parallel in the storage capacitor with the first gate electrode GE1 and the first polar plate 416 respectively. As such, a unit capacitance of the storage capacitor C is increased, so that a size of the storage capacitor C can be compressed while the capacitance of the storage capacitor C remains unchanged, thereby reducing an area occupied by the pixel circuit and improving the resolution of the display panel. it is also possible to increase the capacitance of the storage capacitor C under the condition that a size of the storage capacitor C remains unchanged, so that when the storage capacitor C stores a potential signal, it is less affected by a leakage current, thereby improving the stability of the display panel's display effect in a state of low refresh rate or low power consumption.

In step S5, the material of the oxide semiconductor layer 417 is preferably IGZO. Of course, in some other embodiments, the material of the oxide semiconductor layer 417 may also comprise, but is not limited to, oxide semiconductor materials such as indium gallium oxide or indium zinc oxide. The specific material can be selected according to actual needs, and there is no limitation herein. From step S501 to step S502, the second polar plate 418 is formed at the same time by the process of preparing the oxide semiconductor layer 417. As such, when the second polar plate 418 is added, the original film number and film thickness of the display panel can be kept unchanged, and in turn the bending performance of the display panel is not affected. At the same time, the mask and related processes required for preparing the second polar plate 418 alone can be omitted, thereby reducing the complexity of the process flow of the display panel and the production cost.

The beneficial effects of this embodiment of the present invention are: the manufacturing method of the display panel provided by this embodiments of the present invention respectively forms the first polar plate and the second polar plate at the same time by the process of preparing the second gate electrode and the oxide semiconductor layer, so that the number of masks and related processes can be reduced. Therefore, the number of film layers in the display panel and the thickness of the film laminated structure is also reduced, thereby reducing a complexity of a process flow of the display panel and production cost, and improving the bending ability of the display panel and the display effect of the display panel.

In summary, although the present invention has been disclosed in the above preferred embodiments, the above preferred embodiments do not intend to limit the present invention. Various modifications and changes can be made by those skilled in the art without departing from the spirit and scope of the present invention. Therefore, the scope of protection of the present invention is subject to the scope defined by the claims.

What is claimed is:

1. A display panel, comprising:
   a substrate; and
   a thin film transistor (TFT) array layer disposed on the substrate, the TFT array layer being provided with a first TFT, a plurality of second TFTs, and a storage capacitor arranged at intervals therein;
   wherein the first TFT comprises a polysilicon semiconductor layer and a first gate electrode laminated on each other, each of the second TFTs comprises an oxide semiconductor layer and a second gate electrode laminated on each other, the storage capacitor comprises a first polar plate and a second polar plate opposite to each other, the first polar plate is disposed in a same layer and comprises a same material as the first gate electrode, and the second polar plate is disposed in a same layer and comprises a same material as the second gate electrode,
   wherein the TFT array layer comprises a first gate insulation layer and a first interlayer insulation layer laminated on the polysilicon semiconductor layer in sequence, the first gate electrode is disposed between the first gate insulation layer and the first interlayer insulation layer, and the oxide semiconductor layer is disposed on a side of the first interlayer insulation layer away from the first gate insulation layer,
   wherein the TFT array layer further comprises a second gate insulation layer and a second interlayer insulation layer laminated on the side of the first interlayer insulation layer away from the first gate insulation layer in sequence, and the second polar plate and the second gate electrode are disposed between the second gate insulation layer and the second interlayer insulation layer,
   wherein the second polar plate and the second gate electrode are made of a same layer of metal,
   wherein the storage capacitor comprises a first capacitor and a second capacitor connected in parallel, a third polar plate is disposed between the first polar plate and the second polar plate, the third polar plate and the first polar plate constitute the first capacitor, and the third polar plate and the second polar plate constitute the second capacitor.

2. The display panel as claimed in claim 1, wherein a distance between a surface of the oxide semiconductor layer adjacent to the substrate and the substrate is greater than a distance between a surface of the polysilicon semiconductor layer adjacent to the substrate and the substrate, wherein the oxide semiconductor layer is disposed in a layer between the first gate electrode and the second polar plate.

3. The display panel as claimed in claim 1, wherein the first interlayer insulation layer is a laminated structure made of silicon nitride and silicon oxide materials, and an atomic percentage of silicon-hydrogen bonds in the first interlayer insulation layer ranges between 20% to 30%.

4. The display panel as claimed in claim 1, wherein an orthographic projection of the third polar plate on the substrate overlaps an orthographic projection of the first gate electrode or the second polar plate on the substrate.

5. The display panel as claimed in claim 1, wherein the third polar plate is disposed in a same layer with the oxide semiconductor layer.

6. The display panel as claimed in claim 5, wherein the third polar plate and the oxide semiconductor layer are made of a same layer of an oxide material.

7. The display panel as claimed in claim 1, wherein the first TFT comprises a first source electrode and a first drain electrode, the second TFTs comprise a second source electrode and a second drain electrode, the first source electrode and the first drain electrode are connected to the polysilicon semiconductor layer through first via holes, the first via holes pass through the second interlayer insulation layer, the second gate insulation layer, the first interlayer insulation layer, and the first gate insulation layer, the second source electrode and the second drain electrode are connected to the oxide semiconductor layer through second via holes, and the second via holes pass through the second interlayer insulation layer and the second gate insulation layer.

8. A display device, comprising a device body and a display panel disposed on the device body, the display panel comprising:
a substrate; and
a thin film transistor (TFT) array layer disposed on the substrate, the TFT array layer being provided with a first TFT, a plurality of second TFTs, and a storage capacitor arranged at intervals therein;
wherein the first TFT comprises a polysilicon semiconductor layer and a first gate electrode laminated on each other, each of the second TFTs comprises an oxide semiconductor layer and a second gate electrode laminated on each other, the storage capacitor comprises a first polar plate and a second polar plate opposite to each other, the first polar plate is disposed in a same layer and comprises a same material as the first gate electrode, and the second polar plate is disposed in a same layer and comprises a same material as the second gate electrode,
wherein the TFT array layer comprises a first gate insulation layer and a first interlayer insulation layer laminated on the polysilicon semiconductor layer in sequence, the first gate electrode is disposed between the first gate insulation layer and the first interlayer insulation layer, and the oxide semiconductor layer is disposed on a side of the first interlayer insulation layer away from the first gate insulation layer,
wherein the TFT array layer further comprises a second gate insulation layer and a second interlayer insulation layer laminated on the side of the first interlayer insulation layer away from the first gate insulation layer in sequence, and the second polar plate and the second gate electrode are disposed between the second gate insulation layer and the second interlayer insulation layer
wherein the storage capacitor comprises a first capacitor and a second capacitor connected in parallel, a third polar plate is disposed between the first polar plate and the second polar plate, the third polar plate and the first polar plate constitute the first capacitor, and the third polar plate and the second polar plate constitute the second capacitor.

9. The display device as claimed in claim 8, wherein a distance between a surface of the oxide semiconductor layer adjacent to the substrate and the substrate is greater than a distance between a surface of the polysilicon semiconductor layer adjacent to the substrate and the substrate.

10. The display device as claimed in claim 8, wherein the first interlayer insulation layer is a laminated structure made of silicon nitride and silicon oxide materials, and an atomic percentage of silicon-hydrogen bonds in the first interlayer insulation layer ranges between 20% and 30%.

11. The display device as claimed in claim 8, wherein the second polar plate and the second gate electrode are made of a same layer of metal.

12. The display device as claimed in claim 8, wherein an orthographic projection of the third polar plate on the substrate overlaps an orthographic projection of the first gate electrode or the second polar plate on the substrate.

13. A display device, comprising a device body and a display panel disposed on the device body, the display panel comprising:
a substrate; and
a thin film transistor (TFT) array layer disposed on the substrate, the TFT array layer being provided with a first TFT, a plurality of second TFTs, and a storage capacitor arranged at intervals therein;
wherein the first TFT comprises a polysilicon semiconductor layer and a first gate electrode laminated on each other, each of the second TFTs comprises an oxide semiconductor layer and a second gate electrode laminated on each other, the TFT array layer further comprises a first gate insulation layer, a first interlayer insulation layer, a second gate insulation layer, and a second interlayer insulation layer laminated on the polysilicon semiconductor layer in sequence, the storage capacitor comprises a first polar plate and a second polar plate opposite to each other, the first polar plate is disposed in a same layer and comprises a same material as the first gate electrode, and the second polar plate and the second gate electrode are arranged in a same layer, comprise a same material and disposed between the second gate insulation layer and the second interlayer insulation layer,
wherein the TFT array layer comprises a first gate insulation layer and a first interlayer insulation layer laminated on the polysilicon semiconductor layer in sequence, the first gate electrode is disposed between the first gate insulation layer and the first interlayer insulation layer, and the oxide semiconductor layer is disposed on a side of the first interlayer insulation layer away from the first gate insulation layer,
wherein the TFT array layer further comprises a second gate insulation layer and a second interlayer insulation layer laminated on the side of the first interlayer insulation layer away from the first gate insulation layer in sequence,
wherein the storage capacitor comprises a first capacitor and a second capacitor connected in parallel, a third polar plate is disposed between the first polar plate and the second polar plate, the third polar plate and the first polar plate constitute the first capacitor, and the third polar plate and the second polar plate constitute the second capacitor.

* * * * *